(12) United States Patent
Stojancic

(10) Patent No.: US 7,219,184 B2
(45) Date of Patent: *May 15, 2007

(54) METHOD AND APPARATUS FOR LONGEST PREFIX MATCHING IN PROCESSING A FORWARDING INFORMATION DATABASE

(75) Inventor: Mihailo M. Stojancic, Cary, NC (US)

(73) Assignee: ISIC Corporation, Cary, NC (US)

( * ) Notice: Subject to any disclaimer, the term of this patent is extended or adjusted under 35 U.S.C. 154(b) by 557 days.

This patent is subject to a terminal disclaimer.

(21) Appl. No.: 10/692,425

(22) Filed: Oct. 23, 2003

(65) Prior Publication Data

US 2004/0205229 A1    Oct. 14, 2004

Related U.S. Application Data

(60) Provisional application No. 60/436,960, filed on Dec. 30, 2002, provisional application No. 60/432,168, filed on Dec. 10, 2002.

(51) Int. Cl.
*G06F 12/00* (2006.01)

(52) U.S. Cl. .......................... 711/5; 711/108; 711/128; 711/163; 711/164; 713/182; 707/6

(58) Field of Classification Search ................ 711/5, 711/108, 128, 163, 164; 713/182; 707/6
See application file for complete search history.

(56) References Cited

U.S. PATENT DOCUMENTS 6,499,081 B1    12/2002 Nataraj et al.
7,093,092 B2 *    8/2006 Stojancic .................... 711/164

* cited by examiner

*Primary Examiner*—Sanjiv Shah
*Assistant Examiner*—Midys Rojas
(74) *Attorney, Agent, or Firm*—Priest & Goldstein, PLLC

(57) ABSTRACT

A hardware circuit implemented on a DRAM foundry is provided for finding the longest prefix key match. The hardware circuit includes the use of prefix search engines to store prefix keys. Each prefix search engine may advantageously include an n-dimension memory for fast efficient access. Each prefix search engine is preassigned to store prefix keys having a specific length. Based on the preassignment and the n-dimensional memory, the hardware circuit matches the longest prefix key stored in the prefix search engines by comparing all prefix search engines in parallel.

8 Claims, 11 Drawing Sheets

| | Memory Bank I | Memory Bank II | Memory Bank III | Memory Bank IV | Memory Bank V | Memory Bank VI |
|---|---|---|---|---|---|---|
| 0 | 22347 | | | | | |
| 1 | 15432 | 13245 | | | | |
| 2 | 756 | 29746 | 14576 | | | |
| 3 | 9857 | 23587 | | | | |
| 4 | 27863 | | 21984 | | | |
| 5 | 17659 | 11897 | | | | |
| 6 | 20793 | 10259 | | | | |
| 7 | 6754 | | | | | |
| 8 | | | | | | |
| 9 | 19873 | 25673 | | | | |
| 10 | 3897 | | | | | |
| 11 | 3768 | | | | | |
| 12 | 1325 | | | | | |

FIG. 6

METHOD AND APPARATUS FOR LONGEST PREFIX MATCHING IN PROCESSING A FORWARDING INFORMATION DATABASE

This application claims the benefit of U.S. Provisional Application Ser. No. 60/432,168 filed on Dec. 10, 2002 and U.S. Provisional Application Ser. No. 60/436,960 filed on Dec. 30, 2002, both of which are incorporated by reference herein in their entirety.

U.S. application Ser. No. 10/653,762 entitled "Methods and Apparatus for Data Storage and Retrieval" filed on Sep. 3, 2003 and U.S. application Ser. No. 10/654,501 entitled "Methods and Apparatus for Modular Reduction Circuits" filed on Sep. 3, 2003 are also incorporated by reference herein in their entirety.

FIELD OF THE INVENTION

The present invention relates generally to improved methods and apparatus for storing and retrieving data in computer memory where a longest prefix key is matched, and more particularly, to advantageous techniques for looking up data, for example, such as Internet protocol (IP) forwarding information database (FIB) lookup associated with Internet packet routing when a packet is processed in a high speed network.

BACKGROUND OF THE INVENTION

The growing network of packet based routers and bridges used in the Internet and other packet networks in addition to the increased network speeds of routing packets, such as 10 Gigabits per second, as specified in Optical Carrier standard document OC-192, require more efficient handling of the task of looking up forwarding information stored in a FIB table. These FIB tables are found in routers and bridges, for example, and are used to determine how to route an outgoing packet.

Looking up the outgoing port number upon receipt of an incoming packet in a FIB table is typically complex because variable length prefix keys are utilized to determine if an entry in the FIB table matches a unique key extracted from the incoming packet. Considering that the incoming packet contains an IP destination address which has 32 bits, typical variable length prefixes have lengths ranging from 1 to 32 bits. When a prefix has a length less than 32 bits, a 32 bit word is still typically stored in the FIB table and only the prefix bits are matched against the IP destination address and the unused bits are considered operationally as "don't cares", meaning those bits are not compared to the incoming packet's destination address.

Adding to the complexity of looking up data in a FIB table, shorter length prefixes may be subsets of longer length prefixes which would typically result in multiple matches. To resolve multiple matches, the Internet protocol specifies that the longest length mask which matches the incoming key's destination address should be chosen.

Considering the expanding Internet network and the speed at which data travels through the network, the FIB table lookup problem often requires the capability for achieving a sustained packet forwarding rate of at least 25 million packets per second (MPPS), while maintaining an update rate of at least 2000–3000 updates per second. Any solution further requires handling burst FIB table update rates that can be up to 10 times higher than steady state rates. Also the FIB table should be available for lookup at all times in order to minimize the packet drop rate.

There have been many solutions to the FIB table lookup problem. Typical software approaches usually employ radix tree techniques. As a result, software approaches are relatively slow and do not scale well with the increasing size of the Internet and the speed at which data travels through the Internet. To achieve the desired speeds, a typical hardware approach employs ternary content addressable memory (TCAM) device which is based on a special circuit design. A typical TCAM device requires approximately 16 transistors to store one bit of information. Since the current manufacturing technology and state of the art circuit design limits TCAM chips to 18 megabits per chip, assuming 128 k entries with a table entry size of 144 bits, a single TCAM chip may consume up to 300 million transistors, thus pushing the limits of the state of the art silicon manufacturing process.

To address the specific FIB table lookup problem of multiple matches of differing length prefixes, one TCAM approach requires shorter length prefixes that are subsets of longer length prefixes to be stored physically together in a group and in descending order from longest length prefix to shorter length prefix. The longer length prefix is returned because upon matching an incoming packet's key, the approach finds the prefix group and steps through comparing each prefix, starting with the longest prefix and progressing through to the shortest prefix until a first match is found. This typical sequential progression requires that the FIB table maintain its table entries in sorted order to ensure the longest prefix match is always returned.

A ternary content addressable memory approach to solving the longest prefix match problem has been previously described. One recent approach is described in Nataraj et al. U.S. Pat. No. 6,499,081 ("Nataraj"), where an attempt has been made to eliminate the prefix ordering and also to decrease the device power consumption at the expense of more complex logic circuits related to prioritizing matched results and extracting the longest prefix match. However, the circuit based approach of a TCAM device remains a major challenge in actual silicon implementation with respect to both power consumption and density, especially if a large number of wide table entries need to be supported. Further, since TCAM devices require multiple transistors to store one bit of information, real estate on a TCAM device is limited. Due to the real estate limitation and the fact that TCAM automatically compares stored entries with incoming keys, typical TCAM devices only store prefix keys, and any data related to a stored key is then typically stored on an external, non-TCAM memory, requiring multiple levels of indirection to access such related data.

There exists a need for an improved solution to the FIB table lookup problem which is algorithmic and may suitably employ less expensive, embedded, dynamic random access memory (DRAM) devices readily available in multiple silicon manufacturing processes.

The present invention addresses the ever expanding speeds and capacity requirements of today's Internet packet routers by providing an advantageous approach that efficiently utilizes embedded DRAM devices as its underlying technology for the search engine, thus reducing power consumption along with increased memory density and resulting in reduced costs when compared to TCAM approaches.

SUMMARY OF THE INVENTION

Among its several aspects, the present invention provides methods and apparatus for storing a prefix key of a certain length. To achieve the high rates required by routers when routing packets, the present invention advantageously stores prefix keys of a specified length in a prefix search engine. The prefix search engine has been programmably assigned to store prefix keys having a certain length. The prefix search engine includes a format module, an n-dimensional memory as disclosed in U.S. Ser. No. 10/653,762, and a conversion module. The format module masks out one or more bits from an incoming key formed, for example, from selected fields extracted from an IP packet header. The number of bits masked is determined by the prefix key length assigned to the prefix search engine. The n-dimensional memory includes a number of memory banks, the number determined by at least the number of ordinates within an n-dimension representation of a search key. Each memory bank is associated with one of the ordinates within the n-dimension key representation. Each memory bank has a number of memory locations at least equal to the largest valid value for its associated ordinate. The conversion module converts the masked key into an n-dimension representation. The conversion module then optionally stores the masked key with other data into one of the memory locations referenced by an ordinate of the n-dimension representation.

Another aspect of the present invention includes methods and apparatus for storing and retrieving data in computer memory where a longest prefix key is matched with an incoming key. Prefix search engines are assigned to store prefix keys which may vary in length. Each prefix search engine stores prefix keys which match a preassigned length. When a packet arrives, a unique key is extracted from the packet's header. Each prefix search engine masks the unique key according to its preassigned length and converts the masked key into an n-dimension representation. In parallel, each prefix search engine compares its memory locations according to the n-dimension representation and outputs a match indication and a match result, if the masked key successfully compares with one of the stored prefix keys.

A programmable priority controller maintains the preassignment information for each search engine and receives all the match indications from the prefix search engines. The priority controller indicates to a resulting index multiplexer the prefix search engine which stores the longest matched prefixed key. The resulting index multiplexer selects the match result corresponding to the prefix search engine indicated by the priority controller and forwards this result for further processing.

A more complete understanding of the present invention, as well as further features and advantages of the invention, will be apparent from the following Detailed Description and the accompanying drawings.

BRIEF DESCRIPTION OF THE DRAWINGS

FIG. 6 illustrates an exemplary memory map table demonstrating the operation of n-dimensional memory at a small scale.

DETAILED DESCRIPTION

The present invention now will be described more fully with reference to the accompanying drawings, in which several presently preferred embodiments of the invention are shown. This invention may, however, be embodied in various forms and should not be construed as limited to the embodiments set forth herein. Rather, these embodiments are provided so that this disclosure will be thorough and complete, and will fully convey the scope of the invention to those skilled in the art.

Figure 1:
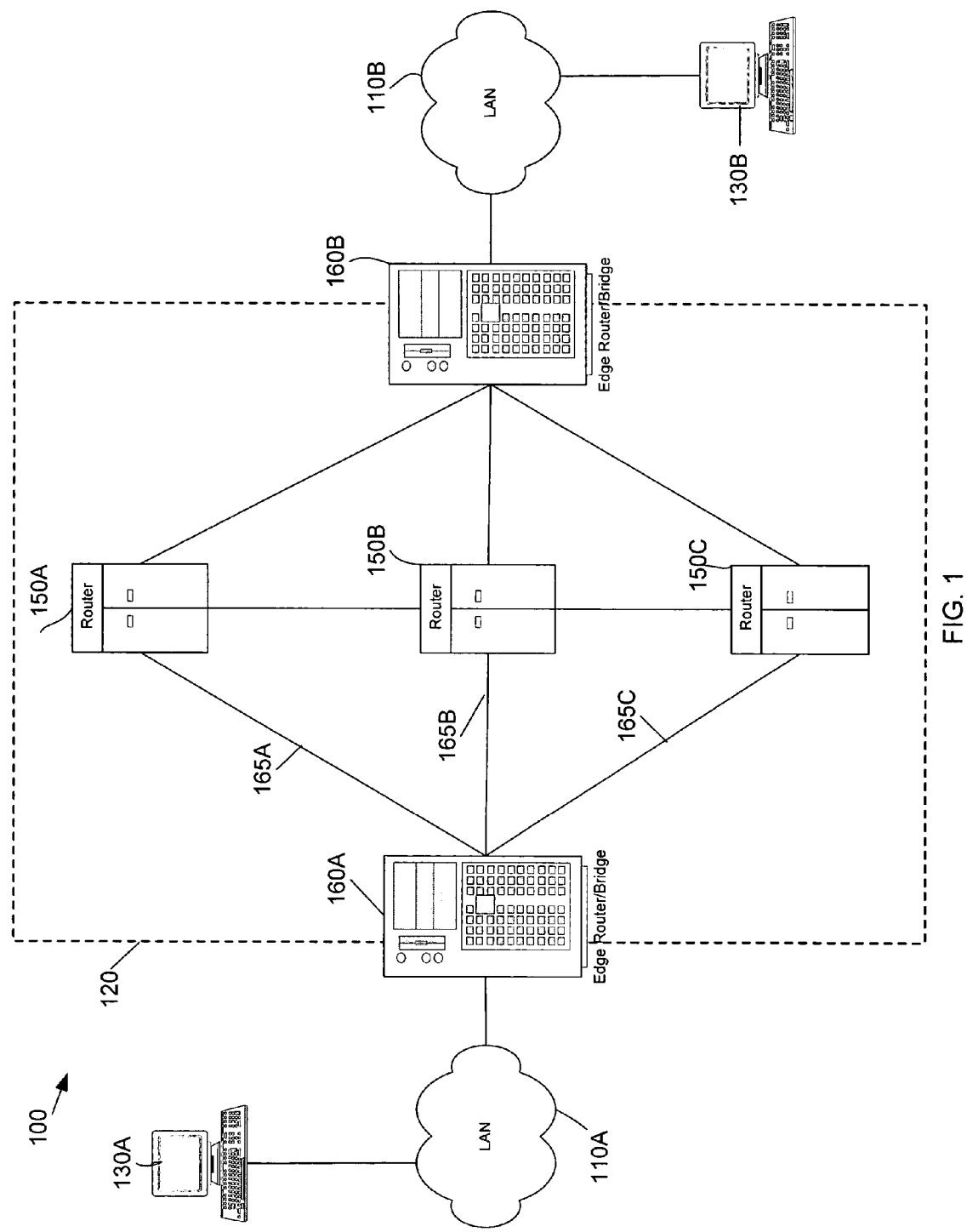
FIG. 1 illustrates an exemplary packet routing network in which the present invention may be advantageously employed.

FIG. 1 illustrates an exemplary packet network 100 in which the present invention may be advantageously employed. The network 100 has two local area networks 110A and 110B connected by a backbone network 120. Local area networks 110A and 110B are also connected to end point computers 130A and 130B, respectively. Although only one computer is illustrated as being connected to each of the LANs 110A and 110B, it should be noted that many computers may and typically will be connected to LANs 110A and 110B. The backbone network 120 includes routers 150A–150C also known as intermediate points. The packet network 100 also includes edge points 160A and 160B. These edge points may be employed as a router or a bridge. Those of ordinary skill in the art will appreciate that the exemplary packet network depicted in FIG. 1 may vary, and that the depicted example is solely for illustrative purposes and is not meant to imply architectural limitations with respect to the present invention.

As addressed in greater detail below, to route a packet of information from end point 130A to end point 130B, electronic devices in accordance with the present invention may be advantageously employed in any of the network end points, intermediate points, or edge points. When routing a packet from end point 130A to end point 130B, for example, the packet is routed through the edge router 160A. The edge router 160A in the depicted example has a choice of three paths 165A–165C through which to route an incoming packet. The edge router 160A chooses a path based upon network conditions and preconfigured prefix keys stored in a FIB table. Indicating a path to route the packet, a port number, for example, would be associated with the preconfigured prefix key. Preconfigured prefix keys may comprise a sequence of fixed length bits as shown in FIG. 2, for example.

When an electronic device in accordance with the present invention is employed at edge router 160A, information from IP packet headers will be extracted from the packet, and together with other bits appended by the route processor used next to form an incoming unique binary key representing the communication between endpoint 130A and endpoint 130B. The key extraction from the IP packet header is described further below in connection with the discussion of FIG. 3. The device contains a separate prefix search engine having an associated preassigned prefix key length as described further below in connection with the discussion of FIG. 4. For each separate prefix search engine, the device strips or masks a number of least significant bits from the incoming key depending on the prefix key length preassigned to the prefix search engine in order to define a prefix key. Each prefix search engine converts the prefix key into a unique n-dimension representation, if a match occurs, and returns the match as described in U.S. patent application Ser. No. 10/653,762. The device selects the longest prefix match based on a priority assigned to each prefix search engine and utilizes the data stored with the selected matched prefix to determine the path over which to route the incoming packet.

Figure 2:
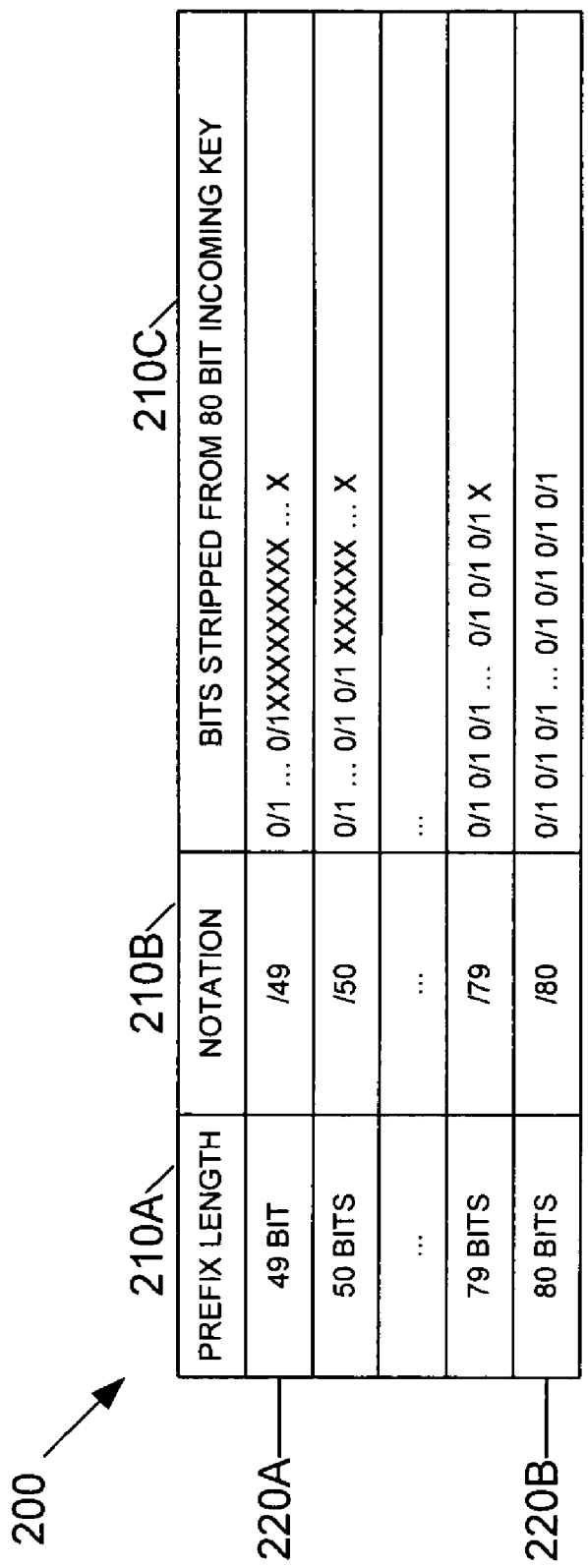
FIG. 2 shows a table listing prefix lengths, a notation used to refer to masks having a certain prefix length, and illustrates relevant bits in a corresponding prefix key.

FIG. 2 shows a table 200 listing prefix lengths in column 210A, a notation used to refer to prefix keys having a certain prefix length in column 210B, and the bits masked from an incoming binary key corresponding bit mask in column 210C to define the relevant bits of a prefix key. For example, first row 220A contains a prefix key having a prefix length of 49 bits. As shown in column 210B, to refer to this prefix key a /49 notation will be used herein. The prefix key for a /49 prefix consists of 49 bits which are compared against a masked incoming key. The 49 prefix bits may have a value of 0 or 1 after having 31 least significant bits masked from the 80 bit incoming key. The masked bits are represented by an "X" in col. 210C. The last row 220B contains a prefix key having a prefix length of 80 bits with no bits masked. The prefix for a /80 prefix key consists of 80 bits which are compared against the entire incoming key.

Figure 3:
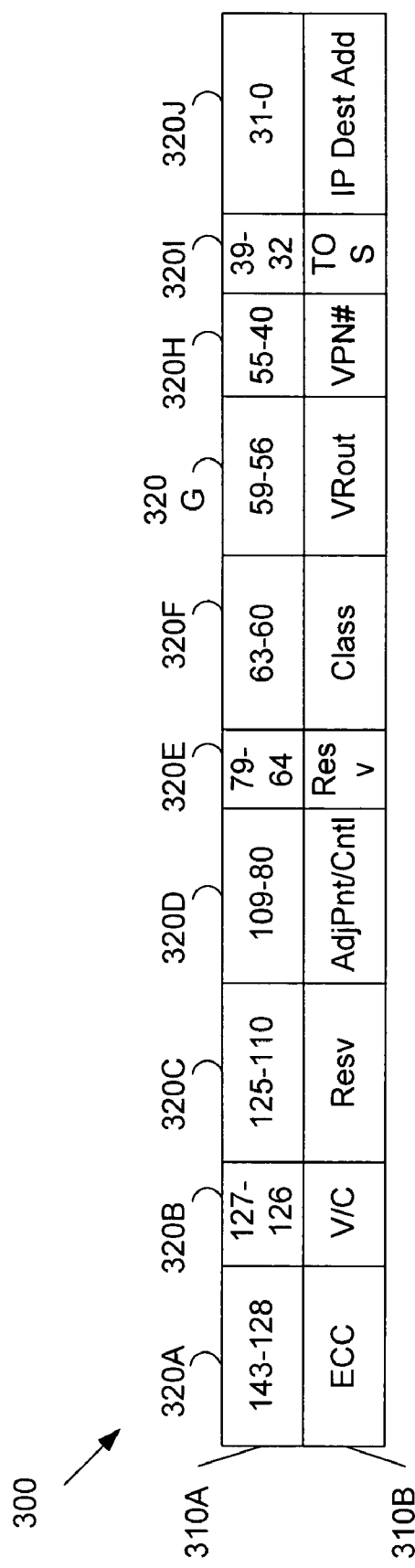
FIG. 3 illustrates a 144 bit FIB table entry based on information extracted from an IP version 4 packet header to compose an 80 bit search key with associated 64 utility bits.

FIG. 3 illustrates a 144 bit FIB table entry 300 based on information extracted from an IP version 4 packet header, the table entry comprising a /80 prefix key. Row 310A illustrates bit positions of the packet header. Row 310B illustrates the meaning of the bits located in their bit positions. For example, at row 310B, column 320A, bit positions 128–143 hold error control coding (ECC) bits which are calculated based on bits from bit position 0–127. At row 310B, column 320B, bit positions 126–127 hold valid and control bits. At row 310B, column 320C, bit positions 110–125 are reserved. At row 310B, column 320D, bit positions 80–109 hold an address to an adjacency table which may hold a port number, control bits, and the like.

At row 310B, column 320E, bit positions 64–79 are reserved. At row 310B, column 320F, bit positions 60–63 hold an Internet protocol class type (Class). At row 310B, column 320G, bit positions 56–59 hold a virtual router number. At row 310B, column 320H, bit positions 40–55 designate the virtual private network number (VPN#). At row 310B, column 320I, bit positions 32–39 hold the type of service (TOS). At row 310B, column 320J, bit positions 0–31 hold the IP destination address.

The /80 prefix key is defined by bit positions 0–79, but the total number of relevant bit positions used to determine a search key for matching an entry can be varied depending on the prefix key length. By way of example, when this entry is stored in a /72 prefix search engine as described in connection with the discussion of FIG. 7, bit positions 8–79 represent the prefix key and bit positions 0–7 are considered don't cares and typically store 0 values. Thus, bit positions 8–79 would then be considered the valid data to which an incoming key is compared. The prefix key as used herein includes bit positions starting with bit position 79 and depending on the size of the prefix key includes any number of consecutive bits up to bit position 0. For example, a /79 prefix would include valid bit positions 79–1. Bit position 0 would contain a "don't care". Thus, bit positions 79–1 would be used as valid data and the corresponding bit positions of an incoming key would be compared with the /79 prefix key.

During FIB table lookup, an incoming key is created from an incoming IP packet header. The information such as information shown in bit positions 0–63 is extracted from the IP packet header to form the incoming key from which an n-dimensional representation is calculated.

Figure 4:
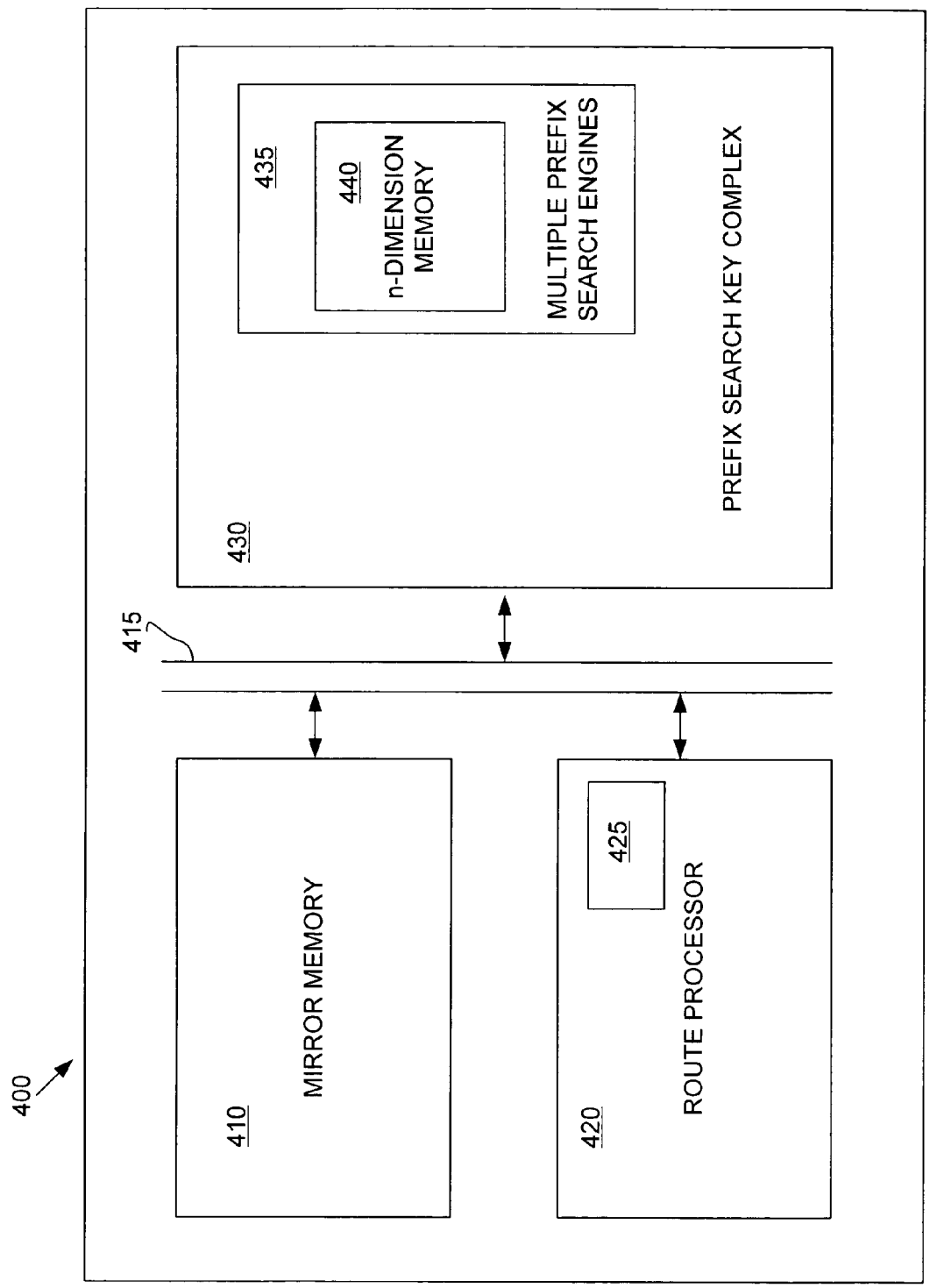
FIG. 4 illustrates an exemplary embodiment of a routing card in accordance with the present invention.

FIG. 4 illustrates an embodiment of the present invention implemented within a daughter card 400. The exemplary daughter card 400 includes an on board route processor 420 having a control and data bus 415 and a clock 425, a prefix search key complex 430, and a mirror memory 410. The prefix search key complex 430 has multiple prefix search engines 435. Each prefix search engine has an n-dimensional memory 440 which contains FIB table entries as shown in FIG. 3 along with additional data such as port numbers, for example. The n-dimensional memory preferably is constructed using DRAM technology. Typically, the prefix search key complex 430 becomes populated with FIB table entries when an administrator of a router containing the daughter card 400 configures routing masks for the router. When populating n-dimensional memory 440 with FIB table entries, the route processor communicates with 410 mirror memory and prefix search key complex 430 over the control and data bus 415 to write the same entries in both the mirror memory 410 and n-dimensional memory 440. Duplicate writes are used so that the route processor may track changes in the prefix search key complex 430. However, during table lookup, the route processor only queries the faster prefix search key complex. The route processor 420 and mirror memory 410 are well known in the art. The n-dimension memory is discussed in further detail in U.S. Ser. No. 10/653,762. Multiple prefix search engines 435 provide fast access to advantageously stored FIB table entries as described in further detail below in connection with the discussion of FIGS. 7 and 9.

Figure 5:
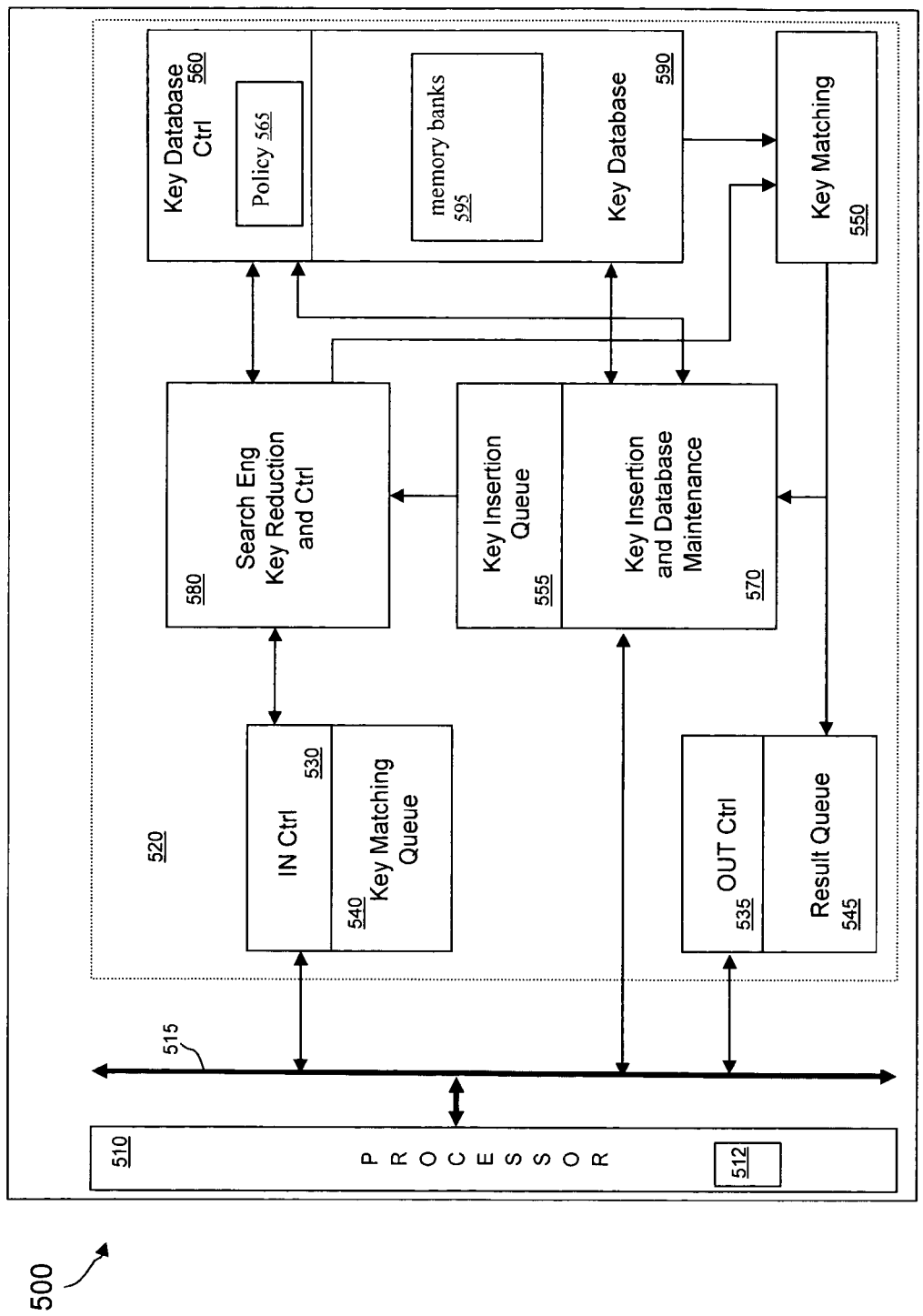
FIG. 5 illustrates an exemplary embodiment of n-dimensional memory without prefix search engines as a daughter card.

FIG. 5 illustrates an exemplary embodiment of n-dimensional memory without prefix search engines as a daughter card 500. The daughter card 500 includes an on board route processor 510 having a control and data bus 515, a clock 512, and a key database complex 520 connected to the control and data bus 515. The key complex 520 includes an input control module 530, a key matching queue 540, a search engine key reduction and control module 580, a key database control module 560, a key database 590, a key matching module 550, a key insertion queue module 555, a key insertion and database maintenance module 570, a result queue 545, and an output control module 535. The input control module 530, the output control module 535, the key matching queue 540, the result queue 545, and the key insertion and database maintenance module 570 are connected to and communicate with the route processor 510 through the processor bus 515. The input control module 530 also is connected to and communicates with the key matching queue 540, and the search engine key reduction and control module 580. The key matching module 550 is connected to and communicates with the result queue 545. The result queue 545 is connected to and communicates with the output control module 535. The search engine key reduction and control module 580 and the key database 590 are connected to and communicate with the key matching module 550. The key insertion queue module 555 is connected and communicates with the search engine key reduction and control module 580. The key insertion and database maintenance module 570 are connected and communicate with the key insertion queue module 555, key database control module 560, key database 590, and the key matching module 550.

During operation, one of two primary paths, the key insertion path and the key match path, are followed through the traffic flow key complex 520. In key insertion operation, when the daughter card 500 receives a packet, the route processor 510 first extracts data fields from packet headers, forms a unique key and associates with it a number of control and command bits according to a preprogrammed schedule. Next, the key together with the control and command bits and associated index or address pointer bits are passed through the processor local bus 515 to the key insertion and database maintenance module 570. The key insertion and database maintenance module 570 reassembles the key and passes it together with an associated command or control bits and index to the key insertion queue 555 where the key awaits processing by the search engine key reduction and control module 580. The search engine key reduction and control module 580 pulls assembled keys from both the key matching queue 540 and the key insertion queue 555 giving higher priority to keys waiting in the key insertion queue 555. When the key search engine 580 processes a key pulled from the key insertion queue 555, keys in the key matching queue 540 are not processed, acting as a lock on flow key database 590 during the insertion process and temporarily suspending the key match path as described further below.

The search engine key reduction and control 580 under the control of the command or control bits associated with a key to be processed, converts the key read from the key insertion queue 555 into a unique n-dimension representation as described below in connection with the discussion of FIG. 6. The n-dimension format of the representation represents n memory banks 595 within the key database 590. The database size, the sum of all the memory locations in each memory bank within the key database 590, corresponds to at least a sum of the largest possible values for each coordinate in the n-dimension format. The search engine key reduction and control 580 through the database control module 560 activates the n memory locations corresponding to the n coordinates of the n-dimension representation of the incoming key. The database control module 560 has a policy sub-module 565 to determine which of the n memory locations will be populated with the extracted key along with information associated with this key. The database control module 560 writes the key to an available memory location which is one location out of the n activated memory locations.

For maintenance purposes, the key insertion and database maintenance module 570 periodically accesses the key database module 590 through the key insertion queue 555, the search engine key reduction and control module 580, and the database control module 560 or directly through the memory data lines of the key database module 590, in order to read, write, or modify entries according to a predetermined schedule programmed by the route processor 510. For example, to clean up old database entries, the key insertion and database maintenance module 570 will periodically scan the entire database in a sequential manner by reading aging parameters associated with each entry directly from memory banks 595. If a particular aging parameter exceeds a predefined threshold, the corresponding entry will be marked as invalid so that a subsequent key may be inserted.

The key insertion and database maintenance module 570 may also receive maintenance commands from route processor 510 to delete a specific key. In this case, since the route processor 510 has no knowledge of the n-dimension representation, the key insertion and database maintenance module 570 places the key in the key insertion queue 555 with control bits indicating deletion, for example. The search engine key reduction and control module 580 will subsequently read the key from key insertion key 555, convert the read key into an n-dimension representation to activate the corresponding read lines into memory banks 595. The key insertion and database maintenance module 570 would then receive an indication of whether the key resides in the database from the key matching module 550. If the key is present, the key insertion and database maintenance module 570 may now delete the memory location containing the key by addressing the memory location in the key database 590.

In a key matching operation, the data and control follow a key match path. When a packet arrives, the route processor 510 first extracts data fields from packet headers, forms a unique lookup key, and associates with it a number of control and command bits according to a preprogrammed schedule. Next, the key together with the control or command bits are passed through the processor's local bus 515 to the input control module 530. The input control module 530 reassembles the key into the key matching queue 540 where the key awaits processing by the search engine key reduction and control module 580. The key search engine module 580, under the control of the command or control bits associated with the key to be processed, converts the next key awaiting in the key matching queue 540 into a unique n-dimension representation in accordance with the present invention as described further below in connection with the discussion of FIG. 6. Next, the search key reduction and control module 580 passes the data to the database control 560 which subsequently activates n read lines, one read line for each of the n memory banks, connecting the key database module 590 and the key matching module 550. The activated read lines activate one memory location in each memory bank 595 within the key database 590 corresponding to each coordinate of the n-dimension representation of the incoming key. The key matching module 550 reads the activated read lines and compares simultaneously the keys stored in the n memory locations with the incoming key. If there is a match, the data associated with the matched memory location is outputted from the matching result 550 to the result queue 545. The output control module 535 acts as a master controller of the result queue 545. As such, the output control module 535 activates the read lines to the result queue 545 and generates the control signals on the bus 515 for the route processor 510 to retrieve the resulting data. If there is no a match, the extracted key is passed to the key insertion and database maintenance module 570 for possible insertion into the database. Further description of the advantageous conversion technique and the advantageous memory addressing technique will be provided below in connection with the discussion of FIG. 6.

To convert a key, such as a scalar unique binary number, into n-dimension format, the conversion process adheres to certain mathematical relationships. To represent a binary number x in n-dimension format, the modular representation of a binary number where x is less than m, a set of moduli is used where the set of moduli $m_1, \ldots, m_n$ satisfies the condition $m = m_1 * m_2 * \ldots m_{n-1} * m_n$. The greatest common factor(gcf) across all $m_n$ is 1. Mathematically, this mutually prime condition is written as $gcf(m_i, m_j) = 1$, for all m combinations where i≠j. An n-dimension format $(x_n, \ldots, x_1)$ is then defined where $x_i = x \bmod m_i$ and integer i changes from 1 to n and specifies the ordinal position of the n-dimension format. The set of modular representations for all integers x where x<m is called a residue number system (RNS). The variable m represents the dynamic range of the RNS, whereas all the combinations of the unique scalar key are referred to the table, database, or address space. The above statements are derived from a well known theorem of number theory referred to as the "Chinese Remainder Theorem" (CRT).

By way of example, a two dimension expansion is described for representing up to sixteen integers in the range 0 to 15. Two residue are then selected which satisfy $\gcd(m_1, m_2)=1$ and $m_1 * m_2 > 16$. One satisfactory set includes $m_1=3$ and $m_2=7$. Thus, the 2-dimension representation of 11, for example, would be (2, 4) since 11 mod 3 equals 2 and 11 mod 7 equals 4. With this 2-dimension representation and as a result of multiplying $m_1$ by $m_2$, 21 integers may be represented uniquely. The number of integers that can be represented by an n-dimension format is called its dynamic range.

For a three dimension expansion representing up to sixteen integers in the range of 0 to 15, three moduli would be selected, for example, 3, 7, and 11, with the dynamic range for the $RNS_3$ system increasing to 231 instead of 21. Thus, all integers in the range $0 \leq x \leq 231$ can be represented in this system in a unique way.

Since representing a single number in an n-dimension format is unique, it can be efficiently used to perform a table lookup once a key is converted from the binary number space into a corresponding residue number space. The following is an example of representing decimal numbers in a 6-dimension format and mapping those numbers into corresponding memory modules.

Taking a set of numbers x in the range of $0 \leq x < 30,000$. A set of mutually prime numbers is selected such that their product is greater than a 30,000 address space. One possible selection is:

$m_1=2$, $m_2=3$, $m_3=5$, $m_4=7$, $m_5=11$, $m_6=13$.

This selection defines an $RNS_6$ system with the total product of all moduli $M=2*3*5*7*11=30,030$ which is greater than 30,000. Hence, this set of moduli will satisfy the above conditions. It can be easily verified that the $\gcd(m_i, m_j)=1$, for all i≠j.

Now, the integer number to $RNS_6$ conversion of an arbitrary selection of 20 numbers (756, 1325, 3768, 3897, 6754, 9857, 10259, 11897, 13245, 14576, 15432, 17659, 19873, 20793, 21984, 22347, 23587, 25673, 27863, 29746) within a given dynamic range of $0 \leq x < 30,000$, will produce a set of 6-dimension numbers as follows. For example, the number 756 is converted to a 6-dimension representation by dividing 756 by 13, 11, 7, 5, 3, and 2, respectively, using modular division. The first ordinal position or coordinate as a matter of convention is the right most number and the sixth ordinal position is left most number. 756 modular 13 equals 2, so the number 2 is written by convention in the first ordinal position. 756 modular 11 equals 8, so the number 8 is written in the second ordinal position. 756 modular 7 equals 0, so the number 0 is written in the third ordinal position. 756 modular 5 equals 1, so the number 1 is written in the fourth ordinal position. 756 modular 3 equals 0, so the number 0 is written in the fifth ordinal position. 756 modular 2 equals 0, the number 0 is written in the sixth ordinal position. The result is that 756 is written as (0,0,1,0,8,2). Similarly, the other 19 arbitrarily chosen integers are converted and displayed in their 6-dimension format below.

756->(0,0,1,0,8,2); 1325->(1,2,0,2,5,12); 3768->(0,0,3,2,6,11);
3897->(1,0,2,5,3,10); 6754->(0,1,4,6,0,7); 9857->(1,2,2,1,1,3);
10259->(1,2,4,4,7,2); 11897->(1,2,2,4,6,2); 13245->(1,0,0,1,1,11);
14576->(0,2,1,2,1,3); 15432->(0,0,2,4,10,1); 17659->(1,1,4,5,4,5);
19873->(1,1,3,0,7,9); 20793->(1,0,3,3,3,6); 21984->(0,0,4,4,6,1);
22347->(1,0,2,3,6,0); 23587->(1,1,2,4,3,5); 25673->(1,2,3,4,10,11);
27863->(1,2,3,3,0,4); 29746->(0,1,1,3,2,2).

The number representations in 6-dimension format of the residue number system uniquely represent the 20 integers chosen arbitrarily to illustrate this procedure.

In a preferred embodiment a key database is formed with keys in the dynamic range considerably smaller than the dynamic range of the underlying RNS system. This step reduces the number of possible keys within the database with a long run of identical coordinates in n-dimensional RNS representation.

Assuming the 20 entries in the above example represent the initial state of the database that needs to be checked to verify if one of the incoming keys ranging in value between 0 and 30,000 has a corresponding database entry, an advantageous memory map may be defined as illustrated in FIG. 6.

FIG. 6 illustrates an exemplary mapping of the 20 arbitrarily chosen integers from the above discussion to six memory banks 610A, 610B, 610C, 610D, 610E, and 610F which may be suitably employed as the memory banks of the key database 590 in FIG. 5, if n=6. Turning to FIG. 6, an exemplary memory map table 600 having six columns labeled 610A–F and thirteen rows labeled 620A–M is shown. The columns labeled 610A–F represent six separate memory banks where column 610A, or memory bank I, represents memory locations indexed by the value of a 6-dimension representation in the first ordinal position, column 610B, or memory bank II, represents memory locations indexed by the value of a 6-dimension representation in the second ordinal position, column 610C, or memory bank III, represents memory locations indexed by the value of a 6-dimension representation in the third ordinal position, column 610D, or memory bank IV, represents memory locations indexed by the value of a 6-dimension representation in the fourth ordinal position, column 610E, or memory bank V, represents memory locations indexed by the value of a 6-dimension representation in the fifth ordinal position, and column 610F, or memory bank VI, represents memory locations indexed by the value of a 6-dimension representation in the sixth ordinal position.

As shown, the number of memory locations of each memory bank corresponds directly to the value of its associated modulus. Thus, the first memory bank 610A is associated with the first ordinal position of a 6-dimension representation which is defined by modulus 13 and contains 13 addressable locations, the second memory module 610B, is associated with the second ordinal position which is defined by modulus 11 and contains 11 addressable locations, the third memory module 610C is associated with the third ordinal position which is defined by modulus 7 and contains 7 addressable locations, the fourth memory module 610D is associated with the fourth ordinal position which is defined by modulus 5 and contains 5 addressable locations, the fifth memory module 610E is associated with the fifth ordinal position which is defined by modulus 3 and contains 3 addressable locations, and the sixth memory module 610F is associated with the sixth ordinal position which is defined by modulus 2 and contains 2 addressable memory locations.

Rows labeled 620A–M represent locations within each memory bank. Row 620A represents the specific value 0 displayed in any ordinal position of a 6-dimension representation. Row 620B represents the specific value 1 displayed in any ordinal position of a 6-dimension representation. Row 620C represents the specific value 2 displayed in ordinal positions 1–5 of a 6-dimension representation. There is no value 2 associated with the sixth ordinal position because the modulus associated with this position is modulus 2. Row 620D represents the specific value 3 displayed in ordinal positions 1–4 of a 6-dimension representation. There is no value 3 associated with the fifth and sixth ordinal position because the moduli associated with these positions is modulus 3 and modulus 2, respectively. Similarly, rows 620E–M represent their respective value within each applicable memory module as defined by the memory modules associated modulus.

The entire database of 20 arbitrarily chosen numbers, mapped into table 600, is now inserted into the six memory banks in such a way that one ordinal position from the corresponding $RNS_6$ 6-dimension representation is used as an address into one of the 6 memory modules. For example, the number 756 which is represented by (0,0,1,0,8,2) has the number 2 in its first ordinal position, and consequently, it is stored in memory bank 610A, at location 2, row 620C. Although number 10,259 which is represented by (1,2,4,4, 7,2) also has the number 2 in its first ordinal position, it cannot be stored at location 2, row 620C. Thus, number 10,259 having a 7 in its second ordinal position is stored in the second memory bank 610B, at location 7, row 620H. Resolving such conflicts of memory locations is preferably determined by a policy as described below. Utilizing a 6-dimension format, the memory map table 600 provides the advantage of providing the choice of six locations to insert a binary key into a memory location. This choice provides the table with a redundancy feature. As with any table lookup, the physical memory size is much smaller than the addressable space as addressed by a key. The redundancy feature may be utilized to resolve conflicts which may result. In a similar manner, the other 18 numbers, as shown in FIG. 6, are inserted into the memories.

The size of the memory system for storing a key database is determined by summing the selected set of moduli. In this example, the set of moduli 2, 3, 5, 7, 11, 13 sums to 41 entries. Hence 41 entries may be used to advantageously map keys from a space of 30,000 potential keys. Since the database is considerably smaller than the total size of the available memory, an efficient memory footprint is achieved. In general, a much larger key resulting in an exponentially larger database space is utilized. A table arranged in accordance with the present invention may be much smaller than the space directly addressable by the number of combinations created by an unconverted scalar key.

For the example illustrated in FIG. 6, the key and corresponding database space are chosen arbitrarily. The set of moduli for $RNS_6$ key representation are chosen according to constraints imposed by the CRT described above. The database size is determined by the chosen set of moduli. It will be recognized that other choices are possible without any loss of generality.

There are multiple ways of inserting the keys and their associated data into one of the n memory locations defined by the n-dimension representation of a key. A policy mechanism determines in which available memory location the key will be inserted. Usually the policy mechanism determines the order in which to insert keys into the $n^{th}$ memory banks by ordinal position of their modulus in the n-dimension format. By convention, the first ordinal position represents the memory bank containing the most memory locations. For example, one policy would insert the key and its associated data to the first available location starting with the memory bank associated with the first ordinal position and progressing sequentially up to the $n^{th}$ ordinal position. Another policy would insert the key and its associated data to the first available location starting with the memory bank associated with the $n^{th}$ ordinal position and progressing sequentially down to the first ordinal position. Simulations have shown that populating the memory bank associated with the first ordinal position results in fewer collisions.

The method of replacement of entries in the mapped database follows the steps described next by an example. If a new key, say 4567, is to replace the 27863 key located at location 4, row 620K of first memory bank 610A, the following steps take place:

The new key is converted from a scalar value into its corresponding residue number system representation: 4567->(1,1,2,3,2,4). The old key, 27863->(1,2,3,3,0,4), entry is invalidated. 4567 is inserted at location 4, row 620E, of first memory bank 610A. This location 4 corresponds to the residue obtained by modular reduction: 4567=4 mod 13. Any additional database associated with the old key may be accessed and updated based on the additional bits associated with this key. It should be noted that if entry 27863 was not deemed old, key 4567 could be stored in location 3 row 620D of the third memory bank 610C corresponding to the number 3 found in the third ordinal position of its n-dimension format.

As described, the size of each memory bank reflects the size of the corresponding modulus from the $RNS_6$. In other words, the size of each memory bank is determined by the largest value of the corresponding coordinate in the n-dimension format. Each memory location may contain the key from the given key database and may also contain an arbitrary number of additional bits associated with it. These additional bits may be used to address an external, separate, database with any additional information related to this key. A validity bit is optionally included in each key entry in order to indicate an active key.

Once a key database is formed and inserted into the memory locations, the problem of matching an incoming key with those existing in the database as illustrated in FIG. 6 is now reduced to converting the new decimal or binary key value into a 6-dimension $RNS_6$ number, then simultaneously addressing 6 memory modules with given residues and comparing the contents of the accessed locations with the incoming key to see whether the key is present or not present in the given database.

For example, if an incoming key 14576 arrives and it is desired to see if a match occurs with an entry stored in table 600, the key would first be converted to its 6-dimension representation which is (0,2,1,2,1,3). Keys stored at memory locations defined by (row 620D, column 610A), (row 620B, column 610B), (row 620C, column 610C), (row 620B, column 610D), (row 620C, column 610E), and (row 620A, column 610F), would be retrieved and compared against 14576. Since 14576 had been previously stored in the location (row 620C, column 610C) a match will be returned for that location. Preferably, this key matching may be done in one step and with a fully deterministic outcome.

In the example shown in FIG. 6, maximum of 41 memory locations are allotted. The ratio of 41 entries to 30,000 possible keys is very small as compared to typical hashing circuits. Also by design the key space can always be reduced to a fraction of the total space spanned by the dynamic range of the underlying RNS system thus eliminating undesirable patterns of keys with a long run of identical coordinates.

In the example above the problem of key matching where an addressing space consists of 30,000 locations, and for a database size of 20 entries, as in this example, is reduced to addressing a set of six smaller memory modules in accordance with the residue magnitudes. The flexibility of key insertion into multiple memory banks, and unique multidimensional key representation, allow for many distinct arrangements of the same set of key database entries within the available memory space.

Figure 7:
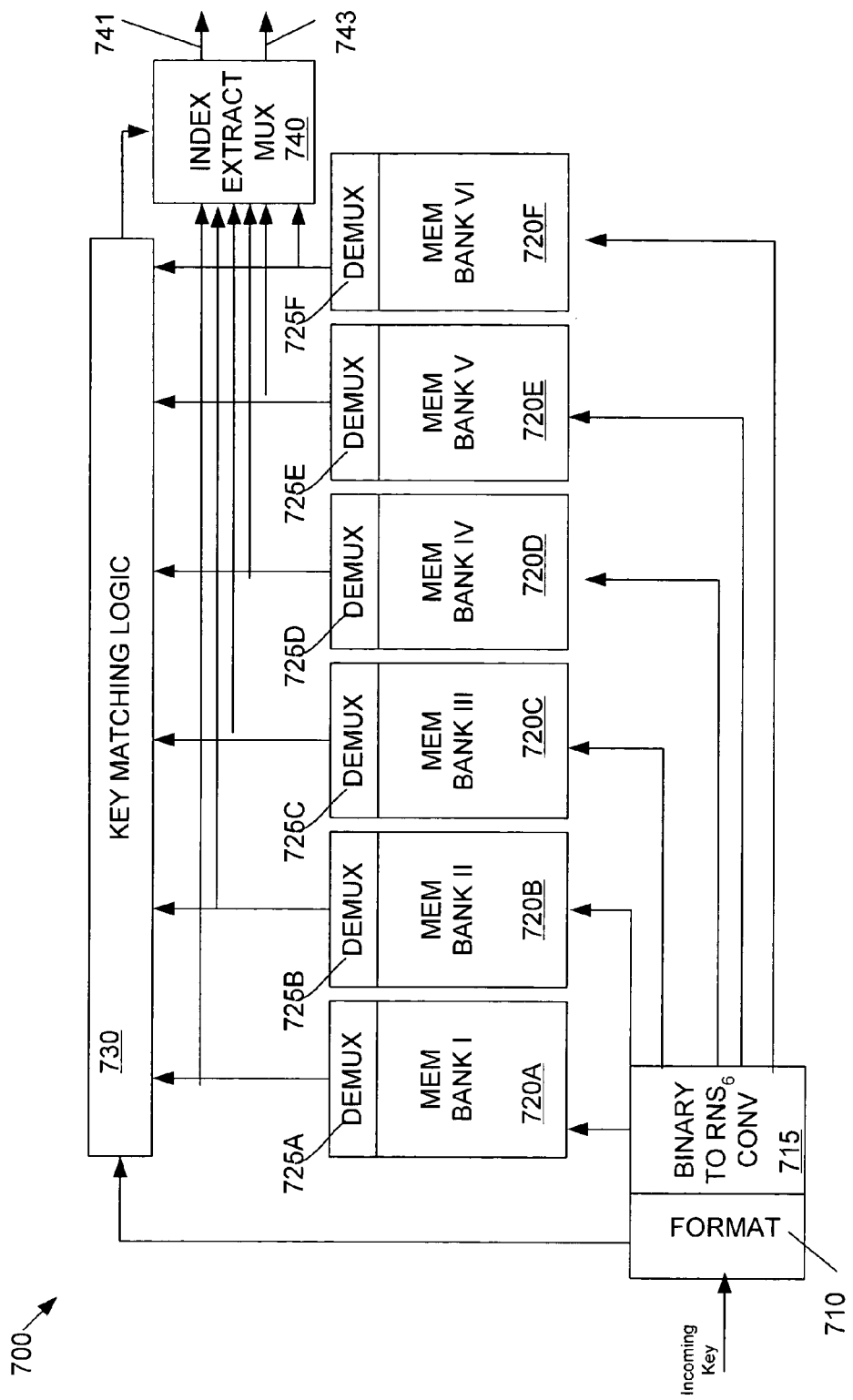
FIG. 7 illustrates an exemplary prefix search engine in accordance with the present invention.

FIG. 7 illustrates an exemplary prefix search engine 700 which may be suitably deployed within prefix search key complex 430. Prefix search engine 700 includes six memory banks 720A–720F, a format module 710, a binary to residue number system conversion module 715, a key matching logic 430, and an index and extractor multiplexer 740.

The prefix search engine 700 is assigned to store a particular prefix key size. There are many techniques for assigning the prefix key size for which a prefix search engine searches. For example, control bits may be sent from the route processor 420 to inform the prefix search engine the prefix key size it will store, the programmable priority control and decoder 1020 described below in connection with FIG. 10 may alternatively signal the prefix search engine accordingly, and the like.

In the example shown in FIG. 7, /79 key prefixes are to be stored in the prefix search engine 700. During FIB table insertion of a table entry, the format module 710 receives an 80 bit incoming key and masks the least significant bit, bit position 0, from the 80 bit mask leaving the /79 prefix key. Such a masking operation typically results in setting bit position 0 to have a value of 0. However, considering that a user typically defines a prefix key, the non-prefix bits may be set to zero before arriving at the prefix search key complex 430. The binary to residue number system conversion module 715 converts the /79 prefix key into a 6-dimensional representation and stores the prefix key along with other data as specified in FIG. 3 into one of the memory banks in the 6-dimensional memory as described in FIGS. 5 and 6 above and further described in U.S. Ser. No. 10/653,762. In this example, each memory bank has the capacity to store 8K 144 bit entries.

During FIB table lookup, the route processor 420 extracts 64 bits from the IP header of an incoming packet containing information corresponding to bit positions 0–63 as shown in FIG. 3. These extracted 64 bits are used to form a unique 80 bit incoming key. The route processor 420 would typically append control information to the 80 bit incoming key to control the behavior of the prefix search engine. For example, control information may be used to activate or deactivate a prefix search engine. The format module 710 excludes irrelevant bits from the incoming key by masking the least significant bit or bits. Since in this example the prefix search engine 700 stores /79 prefixes, the lowest bit of the incoming key is masked by the format module 710. The format module 710 outputs the masked key to key matching logic 730 over data lines and to the residue number system conversion module 715. The residue number system conversion module 715 converts the masked key into an n-dimensional representation as described in U.S. Ser. No. 10/653,762.

In this example, the n-dimensional representation has 6 coordinates, each of which map to memory locations from which data is read. Memory banks 720A–720F have corresponding demultiplexers 725A–725F, respectively, which are discussed further below in connection with the discussion of FIG. 9. Memory banks 720A–720F are accessed by output of the conversion module 715 through address lines, each address line carrying one of the six indexes. Based on the n-dimension representation, memory banks 720A–720F having an entry at each indexed position output the 79 bit prefix key from the 144 bits stored in their respective entry to the key matching logic 730 over data lines. Each of the memory banks having an entry at the indexed position also outputs the utility bits, included in each 144 bit entry, to the index and extraction module 740 over data lines. The key matching logic 730 compares the masked key from the format module 710 with the /79 prefix key stored in each memory module which contained an entry indexed by the n-dimension representation. On a match, the key matching logic 730 selects from which memory module the index extraction module 740 is read. The index extraction module 740 reads the utility bits included in the 144 bit entry from the selected memory module over data lines. The index extraction module 740 outputs index and control bits extracted from the 144 bit entry over data lines 741 and outputs a matching signal over data lines 743.

To support 31 different prefix lengths, /49 through /80, while assigning one prefix length to each prefix search engine in a prefix search key complex, 31 prefix search engines would need to be deployed. To lower the number of prefix search engines needed, the present invention advantageously employs a prefix adjacency technique. In this technique, rather than assigning a prefix engine to store prefix keys having a certain prefix length, a prefix engine is assigned to store prefix keys that have one of two adjacent prefix lengths. For example, adjacent prefix keys /77 and /78 may be stored in one prefix search engine by combining the identical overlapping 77 bits and establishing that the longest prefix keys takes priority over a shorter prefix match.

Thus, a stored /78 prefix key of "10101010101 . . . 0101010101010XX" or /78 prefix key of "10101010 . . . 1010101010101011XX" would preclude any /77 prefix key having the same bits in the first 77 bit positions. However, any one memory entry may be interpreted to be holding one of three different prefix keys where each key has the same 77 bit positions. Hence, the three possible interpretations that can be stored in a memory entry are as follows:

1. /78 prefix key with its least significant bit (LSB) being equal to 1;
2. /78 prefix key with its $78^{th}$ being equal to 0; and
3. /77 prefix key with the $78^{th}$ bit being masked to 0.

Although it should be recognized by one skilled in the art that there are many ways to distinguish whether a /77 or /78 prefix key is stored, an indication is preferably specified in a bit position within the stored table entry. This indication provides the information needed by the prefix search engine to preclude overwriting a /78 prefix key with a /77 prefix key. During table lookup, using the prefix adjacency technique and a prefix search engine for looking up /77 and /78 prefix keys, the format module 710 masks the two irrelevant bits from the 80 bit incoming key. The masked key is then converted to a 6-dimension representation for memory retrieval.

Figure 8:
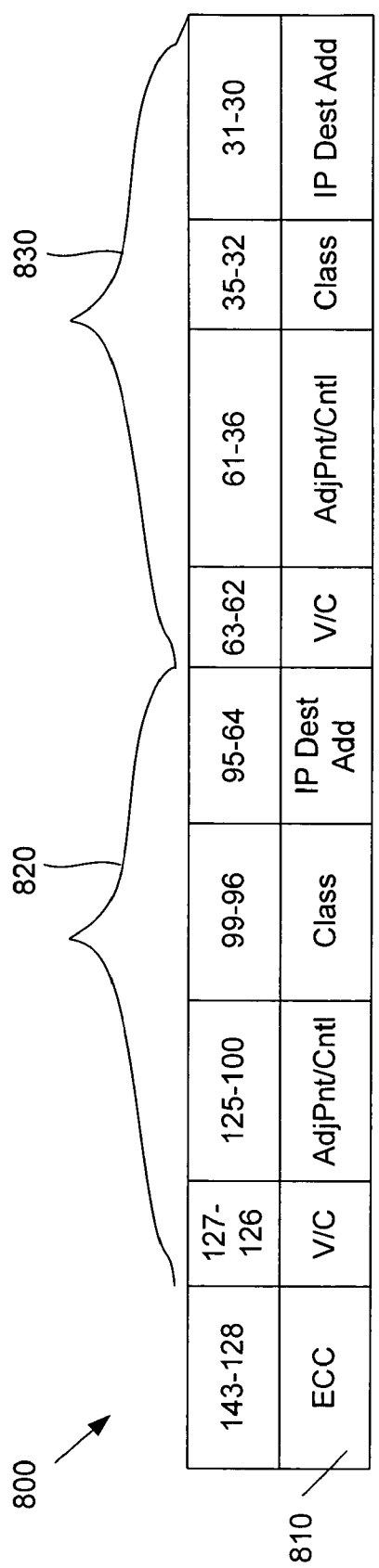
FIG. 8 illustrates a 144 bit FIB table entry comprising two 36 bit keys with associated utility bits.

FIG. 8 illustrates an IP version 4 144 bit FIB table entry 800 comprising two 64 bit prefix key fields 820 and 830 and error control coding bits 810. Each prefix key field includes validity and control bits as shown in bit positions 126–127 and 62–63, an address to adjacency table with associated control bits as shown in bit positions 100–125 and 36–61, and a key consisting of a class type designation as shown in bit positions 96–99 and 32–35, and an IP destination address as shown in bit positions 64–95 and 0–31. Such a table entry arrangement allows the number of prefix keys stored in the prefix search engine 700 to double. This arrangement is particularly useful when packet routing performed on information such as VPN or route number, for example, is not carried in an incoming packet.

Figure 9:
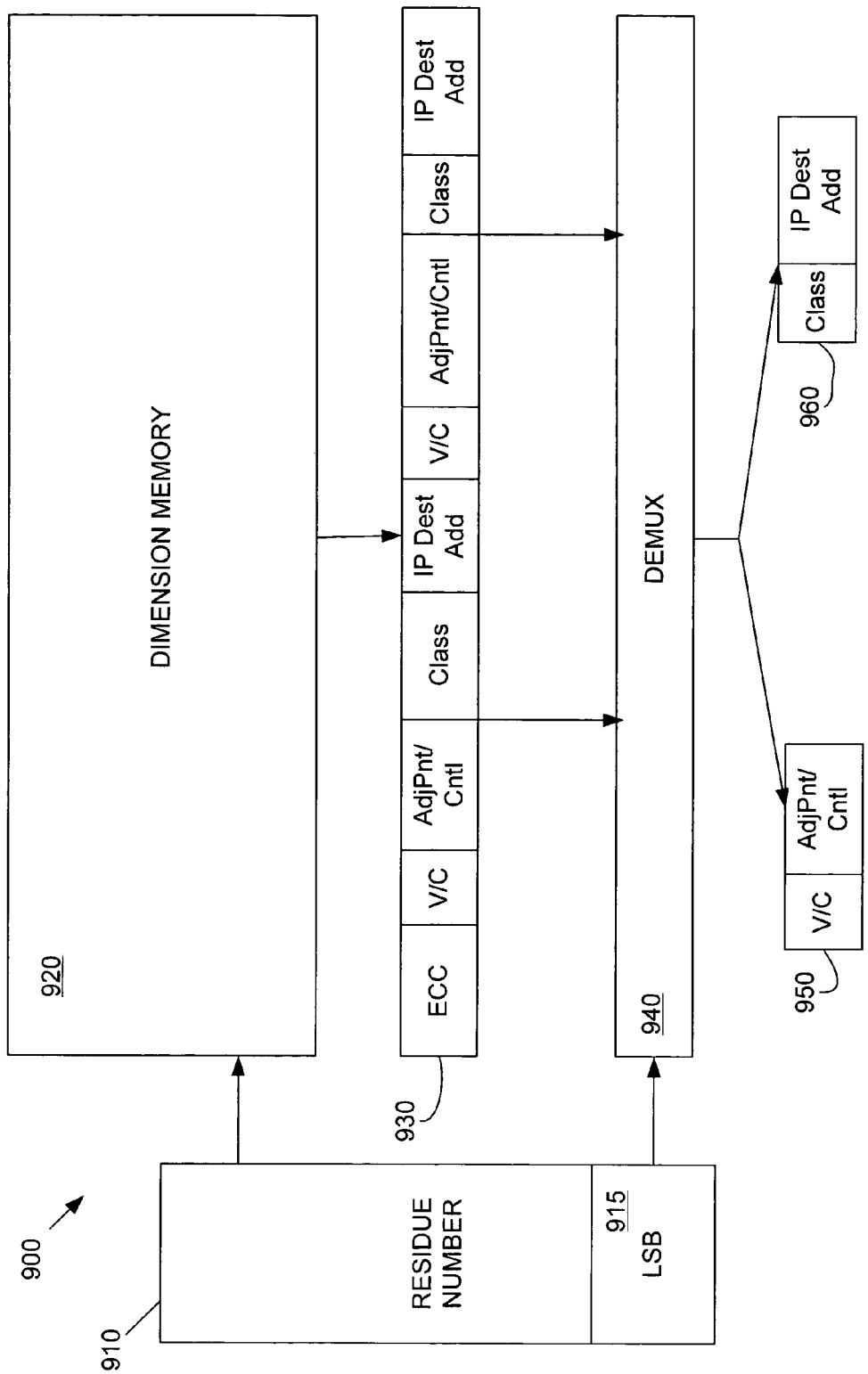
FIG. 9 illustrates a functional block diagram for handling two 36 bit keys with associated utility bits stored in one 144 bit FIB table entry by utilizing a 2:1 demultiplexer.

FIG. 9 illustrates a functional block diagram 900 for handling two 64 bit key fields stored in one 144 bit FIB table entry by a prefix search engine utilizing a 2:1 demultiplexer 940. The 2:1 demultiplexer 940 may be suitably employed as one or more of the demultiplexers 725A–725F. The residue number 910, which may be suitably calculated by a binary to residue number system conversion module 715, is distributed to a dimension memory 920 and the 2:1 demultiplexer 940. Specifically, the least significant bit 915 of the residue number is sent to the 2:1 multiplexer 940 and the remaining bits are sent to the dimension memory 920 for retrieving a table entry 930. The least significant bit of the residue number drives the 2:1 demultiplexer 940 to select the desired 64 bit key entry to pass to key matching logic 730 and the index extract multiplexer 740. The matching result 950 of the selected 64 bit key entry is passed to the index extract multiplexer 740. The prefix key 960 of the selected 64 bit key entry is passed to key matching logic 730.

Figure 10:
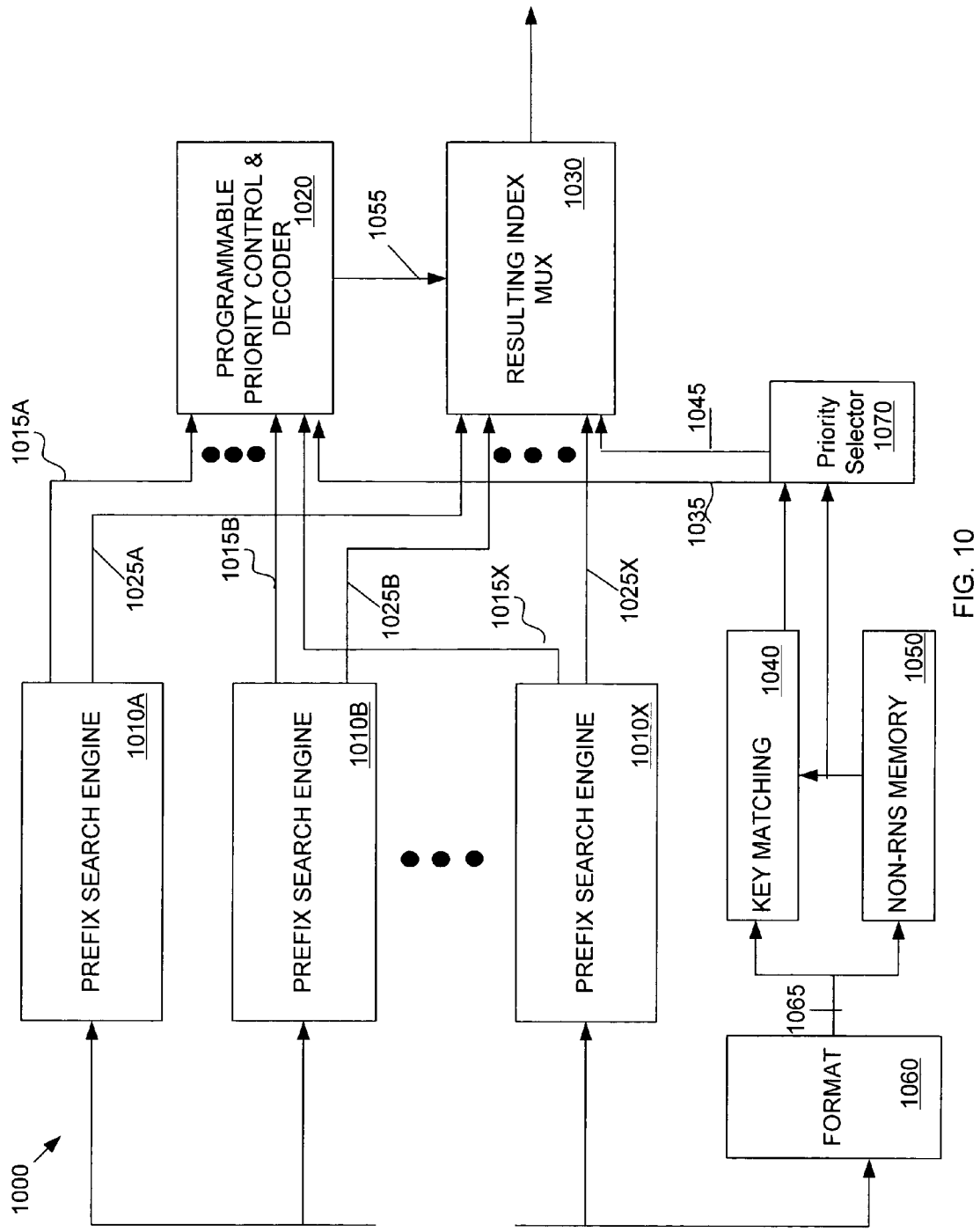
FIG. 10 illustrates an exemplary prefix search system employing prefix search engines as shown in FIG. 7 to perform longest prefix matching utilizing prefix lengths from 49 to 80 bits long.

FIG. 10 illustrates an exemplary prefix search system 1000 employing prefix search engines, such as those of FIG. 7, to perform longest prefix matching utilizing /49 to /80 prefix keys. The prefix search system 1000 includes twenty-four prefix search engines 1010A–1010X as described further above in connection with FIG. 7. The prefix search system 1000 further includes a format module 1060, a key matching module 1040, a non-residue number system matching module 1050, a programmable priority control and decoder 1020, a resulting index multiplexer 1030, and a multiplexer 1070.

The longest prefix search and key matching are performed with multiple prefix search engines. The prefix search engines 1010A–1010X are interchangeable such that any prefix search engine may handle any assigned prefix length or combination of adjacent length masks. Also, to address commonly used prefix lengths, a combination of multiple prefix search engines may advantageously be assigned to store and retrieve a single prefix key length or a pair of contiguous prefix lengths. When a single prefix key is stored across a group of more than one prefix search engines, the route processor 420 sends control information with the unique binary key to control which of the prefix search engines in the group is responsible for storing the incoming prefix key. In one embodiment, the route processor 420 assigns prefix key lengths to be stored in each prefix search engine by sending control signals to the individual prefix search engine and to the programmable priority control and decoder 1020. Providing twenty-four prefix search engines allows flexible assignment of prefix keys to prefix search engines. One assignment, for example, includes the prefix search engine 1010A storing prefix keys /79 and /80, the prefix search engine 1010B storing prefix keys /77 and /78, and so on until prefix search engine 1010L is reached storing prefix keys /57 and /58. In this arrangement, prefix search engines 1010L–1010X would be spare. The spare prefix search engines may advantageously be utilized for redundancy and expanding the memory size of a specific prefix key lengths. The programmable priority control and decoder 1020 is configured in accordance with the search engine assignment to a particular prefix length.

All prefix search engines 1010A–1010X are accessed simultaneously with information extracted from an IP header to form a search key containing information as shown in bit positions 0–79 in FIG. 3. In a preferred embodiment, each prefix search engine, dedicated to a pair of prefix lengths, will mask a number of LSB bits within the 80 bit search key. For example, the prefix search engine dedicated to storing /79 and /80 prefix keys will mask the last bit, effectively setting the last bit to 0, before converting the 80 bit key into a 6-dimension representation to retrieve an entry in the 6-dimension memory.

It is possible that during the search, multiple successful key matches across a number of prefix search engines will occur. The multiple matches, if any, are prioritized based on the configured assignment of prefix key lengths with prefix search engines maintained in the programmable priority control and decoder 1020. The programmable priority control and decoder 1020 receives key matching indications in parallel from all prefix search engines 1010A–1010X over data lines 1015A–1015X. It also performs prioritization among multiple results according to the association of prefix search engine and the prefix key length. Thus, the programmable priority control and decoder 1020 signals the resulting index multiplexer 1030 over data lines 1055 to select the result of the highest priority prefix search engine which has a successful match. The resulting index multiplexer 1030 receives matching results in addition to index and control bits associated by the respective prefix search engines over data lines 1025A–1025X from prefix search engines 1010A–1010X. Matching results may typically consist of any combination of fields shown in table entries described in connection with the discussion of FIG. 3 or FIG. 9. Based on the priority signal received over data lines 1055, the resulting index multiplexer 1030 outputs the match result having the longest prefix key length for further processing.

Format module 1060, key matching module 1040, non-residue matching module 1050, and priority selector 1070 are utilized to search short length prefix keys. Referring to FIG. 3, information in bit positions 32–79 may be configured as a constant value. If so, the remaining bit positions 0–31 representing the IP destination address would vary according to the routing prefixes configured by a network administrator. If the prefix keys are short, for example, the number of relevant bits in the IP destination address is 8 bits or less, those 8 or less bit values may be directly mapped into memory without the need of n-dimensional memory. Direct mapping of a key is well known in the art.

In the example depicted in FIG. 10, the format module 1060 would mask the bits of the incoming key so that 8 or fewer relevant bits in the IP destination address remained. In a manner similar to the preassignment of prefix key lengths to prefix search engines, the format module 1060 would also be preassigned the number of bits to mask. Although FIG. 10 for the sake of clarity shows a single format module 1060, a single key matching module 1040, and a single non-reduced number set (RNS) module 1050, it should be noted that these modules may be duplicated multiple times depending on the number of short prefixes the designer intends to support. This masked key is sent to the non-RNS module 1050 and the key matching module 1040 over lines 1065. Referring to the lines 1065 connected to the non-RNS module 1050, the non-RNS module 1050 would interpret the carried data as indicating an address to memory within the non-RNS module 1050. Referring to the 1065 lines connecting the format module 1060 and the key matching module 1040, the key matching module 1040 would interpret the carried data as data to compare with the data stored in the non-RNS module 1050.

Alternatively, since this approach is a direct mapping approach, rather than deploying a key matching module 1040, a validity bit may be stored within the memory location to indicate whether the entry is valid or not. Because the data is also an address reference, if the entry at the memory location referenced by the address is valid, then the system knows that the key defined by the data has been matched. The memory contents of the non-RNS module 1050 are outputted to the key matching module 1040 and the priority selector 1070. The key matching module 1040 outputs a match indication to the priority selector 1070. The priority selector 1070, aware of which non-RNS modules store a particular length prefix, selects the longest prefix match of short prefixes from the matched output of each non-RNS module 1050. The priority selector outputs a match indication over data line 1035 and a match result over data line 1045.

Figure 11:
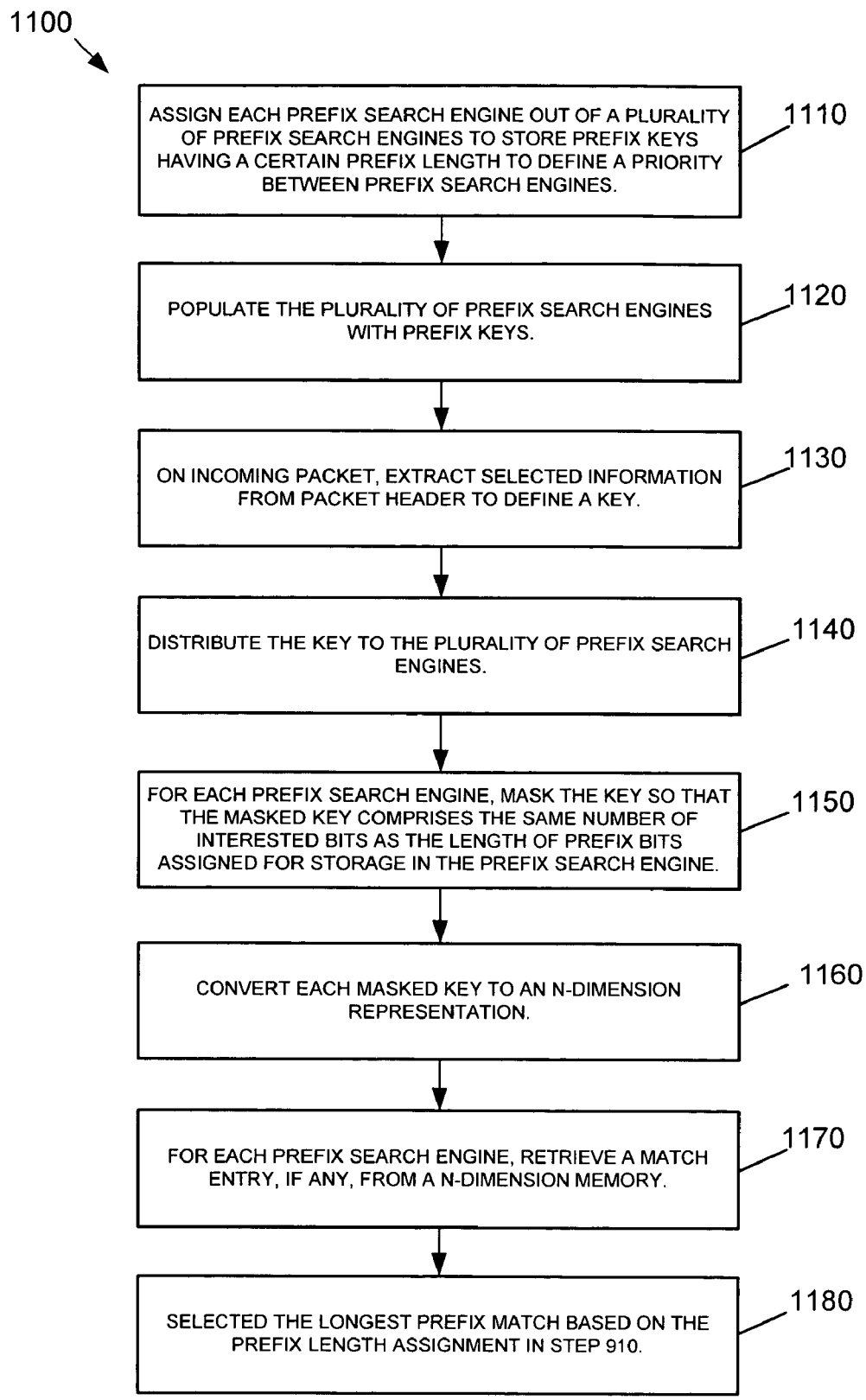
FIG. 11 illustrates a flowchart of a method for matching the longest prefix key in accordance with the present invention.

FIG. 11 illustrates a flowchart 1100 for a method of matching the longest prefix key stored in a table with a unique key in accordance with the present invention. At step 1110, each prefix search engine is assigned to store prefix keys having a certain prefix length to define a priority among the prefix search engines. Preferably, each prefix search engine is assigned to store prefix keys having one of two prefix lengths where the two prefix lengths are sequential. At step 1120, the prefix search engines are populated with prefix keys. At step 1130, upon receiving an incoming packet, selected information is extracted from the packet header to define a unique key. At step 1140, the unique key is distributed to each prefix search engine.

Steps 1150 to 1170 are preferably performed simultaneously by each prefix search engine. At step 1150, for each prefix search engine, the unique key is masked so that the masked key comprises the same number of relevant bits as the length of prefix bits assigned for storage in the prefix search engine. In the case where a prefix search engine stores prefix keys having two sequential prefix lengths, the number of bits masked is determined by the shorter length prefix key assigned to the prefix search engine. At step 1160, each masked key is converted to an n-dimension representation. At step 1170, each prefix search engine retrieves a match entry, if any, from the n-dimension memory. At step 1180, the longest prefix match is selected based on the prefix length assignment.

While the present invention has been disclosed in the context of various aspects of presently preferred embodiments, it will be recognized that the invention may be suitably applied to other environments consistent with the claims which follow. Such environments include data processing systems, individual computers, database systems, and data mining applications, by way of example.

I claim:

1. A prefix search key apparatus for storing a prefix key of a preassigned length comprising:
   a plurality of memory banks, the number of memory banks determined by at least the number of ordinates within an n-dimension representation, the n-dimension representation defining a coordinate system, each bank associated with one of the ordinates within the n-dimension representation, each bank having at least a number of memory locations equal to the largest valid value for its associated ordinate, each ordinate representing a memory location within the associated memory bank;
   a format module for masking out one or more bits from an incoming key, the number of bits to be masked determined by the first prefix key length assigned to the prefix search key apparatus; and
   a conversion module for converting the masked key into an n-dimension representation having a plurality of ordinates, the conversion module storing the masked key into one memory location as referenced by one of the plurality of ordinates.

2. The apparatus of claim 1 wherein the incoming key comprises data extracted from an Internet protocol (IP) packet header.

3. The apparatus of claim 1 wherein the means for assigning the prefix key length assigns a second prefix key length whereby the conversion module stores prefix keys having either the first or second prefix key length.

4. The apparatus of claim 1 further comprising: a demultiplexer for selecting one of two prefix keys stored in the same memory location.

5. The apparatus of claim 1 further comprising: a key matching logic connected to the plurality of memory banks, the key matching logic comparing in a single step a masked key with prefix keys stored at each memory location defined by the n-dimension representation of the incoming key to determine the existence of the masked key.

6. The apparatus of claim 1 wherein each memory location stores additional information associated with the prefix key, wherein additional information is a class indication, a virtual route indication, a virtual private network indication, or an adjacent table pointer and control indication.

7. The apparatus of claim 1 wherein the masked key includes a field wherein the field is a class number, a virtual route number, a virtual private network number, or a type of service number.

8. The apparatus of claim 1 wherein a field is stored with the masked key wherein the field is a pointer to another table entry or a sequence of control bits.

* * * * *